United States Patent
Choi et al.

(10) Patent No.: US 8,610,157 B2
(45) Date of Patent: Dec. 17, 2013

(54) LIGHT EMITTING APPARATUS

(75) Inventors: Kwang Ki Choi, Seoul (KR); Hwan Hee Jeong, Seoul (KR); Sang Youl Lee, Seoul (KR); June O Song, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 12/964,161

(22) Filed: Dec. 9, 2010

(65) Prior Publication Data

US 2011/0133242 A1    Jun. 9, 2011

(30) Foreign Application Priority Data

Dec. 9, 2009   (KR) .................. 10-2009-0121739
Dec. 9, 2009   (KR) .................. 10-2009-0121740
Feb. 3, 2010   (KR) .................. 10-2010-0010048

(51) Int. Cl.
*H01L 33/00* (2010.01)

(52) U.S. Cl.
USPC .................................. 257/99; 257/E33.065

(58) Field of Classification Search
USPC ............................................. 257/99, E33.065
See application file for complete search history.

(56) References Cited

U.S. PATENT DOCUMENTS

| 2001/0050530 A1 | 12/2001 | Murakami et al. |
| 2007/0194325 A1 | 8/2007 | Sung et al. |
| 2008/0048206 A1 | 2/2008 | Lee et al. |
| 2008/0111139 A1 | 5/2008 | Chae et al. |
| 2010/0065872 A1 | 3/2010 | Lee |
| 2010/0264440 A1 | 10/2010 | Park |

FOREIGN PATENT DOCUMENTS

| JP | 2000-0183405 | 6/2000 |
| JP | 2005-136443 | 5/2005 |
| KR | 10-2004-0073434 | 8/2004 |
| KR | 10-0752717 | 8/2007 |
| KR | 10-2009-0116840 | 11/2009 |

OTHER PUBLICATIONS

Machine translation of Murakami et al., JP 2005-136443.*
Machine translation of Sano et al., KR 10-2004-0073434.*
Machine translation of Suenaga, JP 2000-183405.*
Korean Office Action dated Jul. 14, 2010 issued in Application No. 10-2010-0010048.
Korean Notice of Allowance dated Nov. 15, 2010 issued in Application No. 10-2010-0010048.
Chinese Office Action dated Sep. 12, 2012 for related Application Serial No. 2012092000803530.

* cited by examiner

*Primary Examiner* — Hsin-Yi Hsieh
(74) *Attorney, Agent, or Firm* — KED & Associates LLP

(57) ABSTRACT

A light emitting device including a contact layer, a blocking layer over the contact layer, a protection layer adjacent the blocking layer, a light emitter over the blocking layer, and an electrode layer coupled to the light emitter. The electrode layer overlaps the blocking layer and protection layer, and the blocking layer has an electrical conductivity that substantially blocks flow of current from the light emitter in a direction towards the contact layer. In addition, the protection layer may be conductive to allow current to flow to the light emitter or non-conductive to block current from flowing from the light emitter towards the contact layer.

17 Claims, 13 Drawing Sheets

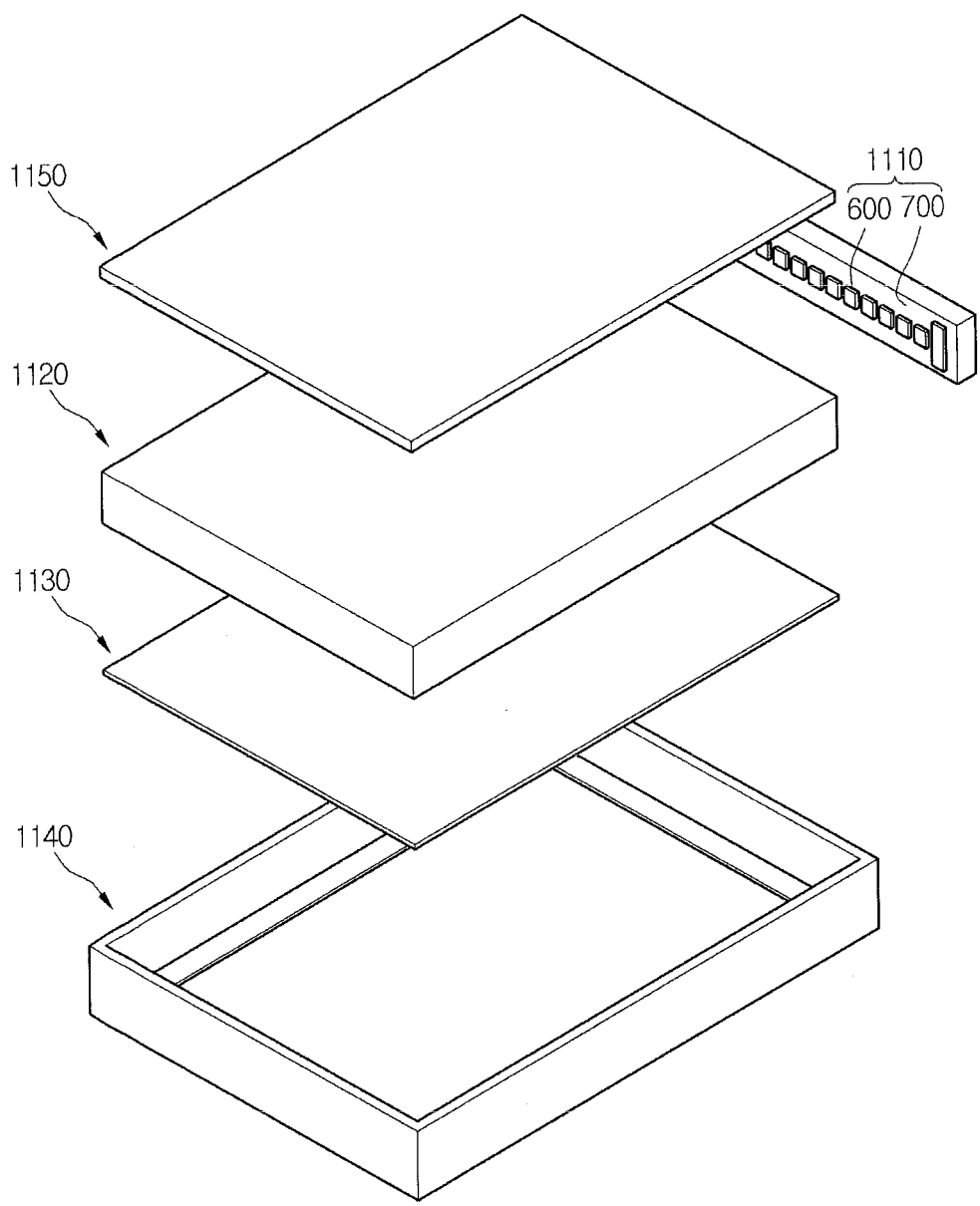

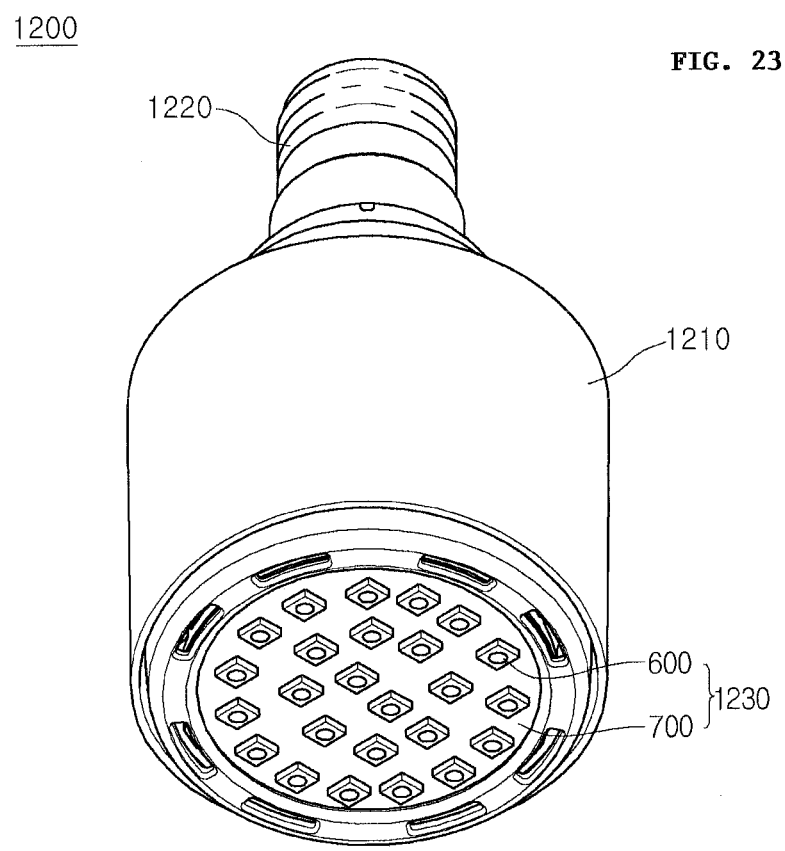

LIGHT EMITTING APPARATUS

The present application claims priority of Korean Patent Applications No. 10-2009-0121739 filed on Dec. 9, 2009, No. 10-2009-0121740 filed on Dec. 9, 2009, and No. 10-2010-0010048 filed on Feb. 3, 2010, which are hereby incorporated herein by reference.

BACKGROUND

1. Field

One or more embodiments described herein relate to emission of light.

2. Background

Light emitting diodes (LED) have advantages in terms of cost and power consumption compared to fluorescent and incandescent lamps. For this reason, LEDs are used in liquid crystal displays, electric bulletin boards and street lamps. In spite of their technological superiority, improvements are still needed.

BRIEF DESCRIPTION OF THE DRAWING

FIG. 22 is a diagram of an embodiment of a backlight unit including the light emitting device package of FIG. 21 and/or one of the aforementioned embodiments of the light emitting device.

FIG. 23 is a diagram of an embodiment of a lighting unit including one of the aforementioned embodiments of the light emitting device or device package.

DETAILED DESCRIPTION

Figure 1:
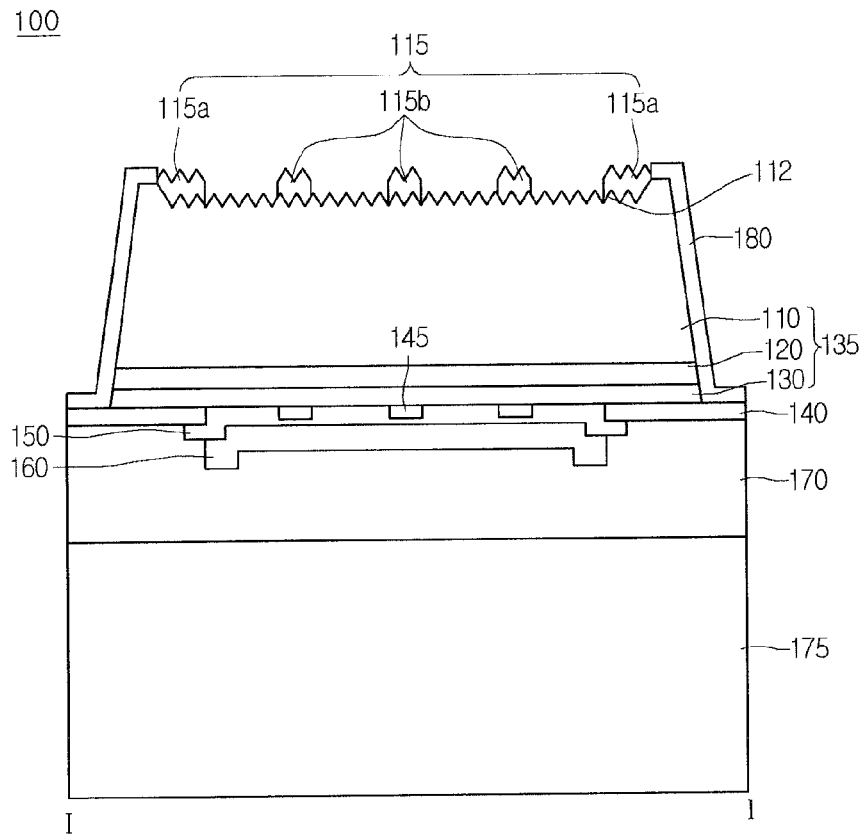
FIG. 1 is a diagram of a first embodiment of a light emitting device.

FIG. 1 shows a first embodiment of a light emitting device that includes a conductive support substrate 175, a bonding layer 170 on the conductive support substrate 175, a reflective layer 160 on the bonding layer 170, an ohmic contact layer 150 on the reflective layer 160, a protection layer 140 at a periphery portion on the bonding layer 170, a light emitting structure layer 135 producing light on the ohmic contact layer 150 and the protection layer 140, and an electrode layer 115 on the light emitting structure layer 135.

The conductive support substrate 175 supports the light emitting structure layer 135 and supplies power to the light emitting structure layer 135 together with the electrode 115. For example, the conductive support substrate 175 may include at least one of Cu, Au, Ni, Mo, or Cu—W and one or more carrier wafers such as, for example, Si, Ge, GaAs, ZnO, SiC, GaN, Ga2O3.

The bonding layer 170 may be formed on the conductive support substrate 175, at a location under reflective layer 160 and protection layer 140. The bonding layer 170 is in contact with the reflective layer 160, the ohmic contact layer 150, and the protection layer 140 such that the reflective layer 160, the ohmic contact layer 150, and the protection layer 140 are bonded to the conductive support substrate 175.

The bonding layer 170 is formed to bond the conductive support substrate 175. Therefore, the bonding layer 170 is not necessarily formed, when the conductive support substrate 175 are plated or deposited, such that the bonding layer 170 may be selectively formed. The bonding layer 170 includes barrier metal or bonding metal and, for example, may include at least one of Ti, Au, Sn, Ni, Cr, Ga, In, Bi, Cu, Ag or Ta.

The reflective layer 160 may be formed on the bonding layer 170, and may serve to improve light extraction efficiency by reflecting incident light from the light emitting structure layer 135. The reflective layer 160 may be made of metal or alloys which include, for example, at least one of Ag, Ni, Al, Rh, Pd, Ir, Ru, Mg, Zn, Pt, Au or Hf. Further, the reflective layer 160 may be formed in a multi-layer structure using metal or alloys and a light transmissive conductive material, such as IZO, IZTO, IAZO, IGZO, IGTO, AZO, or ATO. The reflective layer 160 is provided to increase light efficiency and may not necessarily be formed.

The ohmic contact layer 150 may be formed on the reflective layer 160 in ohmic contact with the second conductive semiconductor layer 130 to allow power to be smoothly supplied to the light emitting structure layer 135. The ohmic contact layer may be formed, for example, of at least any one of ITO, IZO, IZTO, IAZO, IGZO, IGTO, AZO, or ATO.

According to one embodiment, the ohmic contact layer 150 is selectively made of a light transmissive layer and metal, and may be implemented in one layer or a multi-layer structure from one or more of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), IrOx, RuOx, RuOx/ITO, Ni, Ag, Ni/IrOx/Au, or Ni/IrOx/Au/ITO.

The ohmic contact layer 150 is provided to smoothly inject carriers into the second conductive semiconductor layer 130 and may not be necessarily formed. For example, the material used for the reflective layer 160 may be a material that is in ohmic contact with the second conductive semiconductor layer 130. The carriers that are injected into the second conductive semiconductor layer 130 may not be largely different from when the ohmic contact layer 150 is formed.

A current blocking layer (CBL) 145 may be formed in discrete or individual sections between the ohmic contact layer 150 and the second conductive semiconductor layer 130. The top of each section of the current blocking layer 145 is in contact with the second conductive semiconductor layer 130 and the bottom and sides of the current blocking layer 145 is in contact with the ohmic contact layer 150.

The current blocking layer 145 may at least partially overlap the electrode layer 115, and serves to increase current concentration in the light-emitting structure layer 135. This current concentration function allows the distance between the electrode layer 115 and the conductive support substrate 175 to be small, thereby improving light emitting efficiency of the light emitting device 100. Moreover, the current concentration function of the current blocking layer 145 allows large amounts of current to flow in the light emitting structure layer 135.

Each section of the current blocking layer 145 may have a width that is 0.9~1.3 times the width of the electrode. If the electrode layer is formed from a plurality of electrodes (e.g., 115a and 115b), the widths of the sections of the current blocking layer may be 0.9~1.3 times the width of one of electrodes 115a or 115b. According to one embodiment, the sections of the current blocking layer 145 may have widths that is 1.1~1.3 times the width of the electrode layer, or one of the electrodes 115a or 115b in the case the electrode layer includes a plurality of electrodes.

The current blocking layer 145 may be made of a material that has less electrical conductivity than the reflective layer 160 or the ohmic contact layer 150, a material that is in Schottky contact with the second conductive semiconductor layer 130, or an electric insulation material For example, the current blocking layer 145 may include at least one of ZnO, SiO2, SiON, Si3N4, Al2O3, TiO2, Ti, Al, or Cr.

As shown in FIG. 1, the current blocking layer 145 is formed between the ohmic contact layer 150 and the second conductive semiconductor layer 130. However, in an alternative embodiment, the current blocking layer may be formed between the reflective layer 160 and the ohmic contact layer 150. According to another embodiment, a region where current has difficulty flowing may be formed by applying plasma treatment to the second conductive semiconductor layer 130, without forming the current blocking layer 145. In this embodiment, the plasma-treated region may be used as a current blocking region performing a function like the current blocking layer 145.

The protection layer 140 may be formed at a periphery portion on the bonding layer 170. When bonding layer 170 is not included, the protection layer 140 may be formed at a periphery of the conductive support substrate 175.

The protection layer 140 can reduce deterioration in reliability of the light emitting device 100 due to separation of the interface between the light emitting structure layer 145 and the bonding layer 170.

The protection layer 140 may be a conductive layer or a non-conductive layer. A conductive protection layer may be formed from a transparent conductive oxide film or may include at least one of Ti, Ni, Pt, Pd, Rh, Ir, or W.

The transparent conductive oxide film, for example, may be any one of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide).

A non-conductive protection layer may be formed from any one of a variety of non-conductive materials.

When included, the protection layer may prevent fragments from being generated from the bonding layer 170, which may adhere to and cause an electrical short to form between second conductive semiconductor layer 130 and active layer 120 or between active layer 120 and a first conductive semiconductor layer 110, when isolation etching is applied to divide the light emitting structure layer 145 into unit chips in a chip separation process. For this purpose, the protection layer may be made of a material that is resistant to being broken or generating fragments.

If the protection layer has electrical conductivity (conductive protection layer), current can be injected into the light emitting structure layer 135 through the conductive protection layer. Therefore, light can be effectively produced from the active layer on the conductive protection layer around the light emitting structure layer 135.

Further, the conductive protection layer can reduce the operational voltage of the light emitting device by reducing the increase of operational voltage due to the current blocking layer 145. The conductive protection layer may, for example, be made of the same material as the ohmic contact layer 150.

As an alternative to a conductive protection layer, a non-conductive protection layer may be used. This layer may be made of a material having very low electrical conductivity. For example, the non-conductive protection layer 140 may be made of a material significantly smaller in electrical conductivity than the reflective layer 160 or the ohmic contact layer 150, a material that is in Schottky contact with the second conductive semiconductor layer 130, or an electric insulation material. Examples of such a non-conductive material include ZnO or SiO2.

The non-conductive protection layer may serve to increase the distance between the bonding layer 170 and the active layer 120. Therefore, it is possible to reduce the possibility of electric short between the bonding layer 170 and the active layer 120.

In addition, the non-conductive protection layer prevents fragments from being generated from the bonding layer 170, which may adhere to and cause an electrical short to form between second conductive semiconductor layer 130 and an active layer 120 or between the active layer 120 and a first conductive semiconductor layer 110, when isolation etching is applied to divide the light emitting structure layer 145 into unit chips in a chip separation process.

Further, the non-conductive protection layer is made of a material that is resistant to being broken or which forms fragments or a material having electrical conductivity that does not cause an electric short to form, even if it is slightly broken into a small amount of fragments, in the isolation etching.

The light emitting structure layer 135 may be formed on the ohmic contact layer 150 and the protection layer 140. The sides of the light emitting structure layer 135 may be inclined in the isolation etching to allow for separation into unit chips. The inclined surface may at least partially overlap the protection layer 140.

A portion of the top of the protection layer 140 may be exposed by the isolation etching. Therefore, the protection layer 140 may be formed to overlap the light emitting structure layer 135 at a predetermined region and not to overlap the light emitting structure layer 135 at another other region.

The first conductive semiconductor layer 110 may be an n-type layer of a material having a composition formula, $In_xAl_yGa_{1-x-y}N$ ($0 \leq x \leq 1$, $0 \leq y \leq 1$, $0 \leq x+y \leq 1$), for example, InAlGaN, GaN, AlGaN, AlInN, InGaN, AlN, or InN.

The active layer 120 is a layer emitting light, using a band gap difference of an energy band according to the material of the active layer 120, when electrons (or holes) injected through the first conductive semiconductor layer 110 combine with the holes (or electrons) injected through the second conductive semiconductor layer 130.

The active layer 120 may be formed in any one of a single quantum well, a multi-quantum well (MQW), a quantum point, or quantum line structure, but other structures are also possible.

According to one embodiment, the active layer is made of a semiconductor material having the composition formula, $In_xAl_yGa_{1-x-y}N$ ($0 \le x \le 1$, $0 \le y \le 1$, $0 \le x+y \le 1$). When the active layer 120 is formed in a multi-quantum well structure, the active layer 120 may be formed by stacking a plurality of well layers and a plurality of barrier layers, for example, in the order of InGaN well layer/GaN barrier layer.

A clad layer (not shown) doped with an n-type or p-type dopant may be formed on and/or under the active layer 120, and may be implemented by an AlGaN layer or an InAlGaN layer.

The second conductive semiconductor layer 130 may be implemented by, for example, a p-type semiconductor layer selected from a semiconductor material having the composition formula, $In_xAl_yGa_{1-x-y}N$ ($0 \le x \le 2$, $0 \le y \le 1$, $0 \le x+y \le 1$), for example InAlGaN, GaN, AlGaN, InGaN, AlInN, AlN, or InN, and may be doped with a p-type dopant, such as Mg, Zn, Ca, Sr, or Ba.

The first conductive semiconductor layer 110 may be a p-type semiconductor layer and the second conductive semiconductor layer 130 may include an n-type semiconductor layer.

Further, a third conductive semiconductor layer (not shown) including an n-type or a p-type semiconductor layer may be formed on the second conductive semiconductor layer 130. Accordingly, the light emitting structure layer 135 may have at least any one of np, pn, npn, or pnp junction structures. Further, the doping concentration in the first conductive semiconductor layer 110 and the second conductive semiconductor layer 130 may be uniform or non-uniform. That is, the structure of the light emitting structure layer 130 may be modified in various ways and is not limited to those described herein.

The light emitting structure layer 135 including the first conductive semiconductor layer 110, the active layer 120, and the second conductive semiconductor layer 130 may be formed in various structures and is not limited to the structures of the light emitting structure layer 130 which are exemplified in the illustrative embodiments described herein.

The electrode layer 115 is formed on the top of the light emitting structure layer 135 and may be divided in a predetermined pattern. A roughness pattern 112 may be formed on the top of the first conductive semiconductor layer 110 to increase light extraction efficiency. Accordingly, a roughness pattern may be formed on top of the electrode layer 115.

More specifically, electrode layer 115 may be in contact with the top of the first conductive semiconductor layer 110, and may be formed by stacking at least one pad unit and at least one branch-shaped electrode unit in the same or a different structure.

Figure 13:
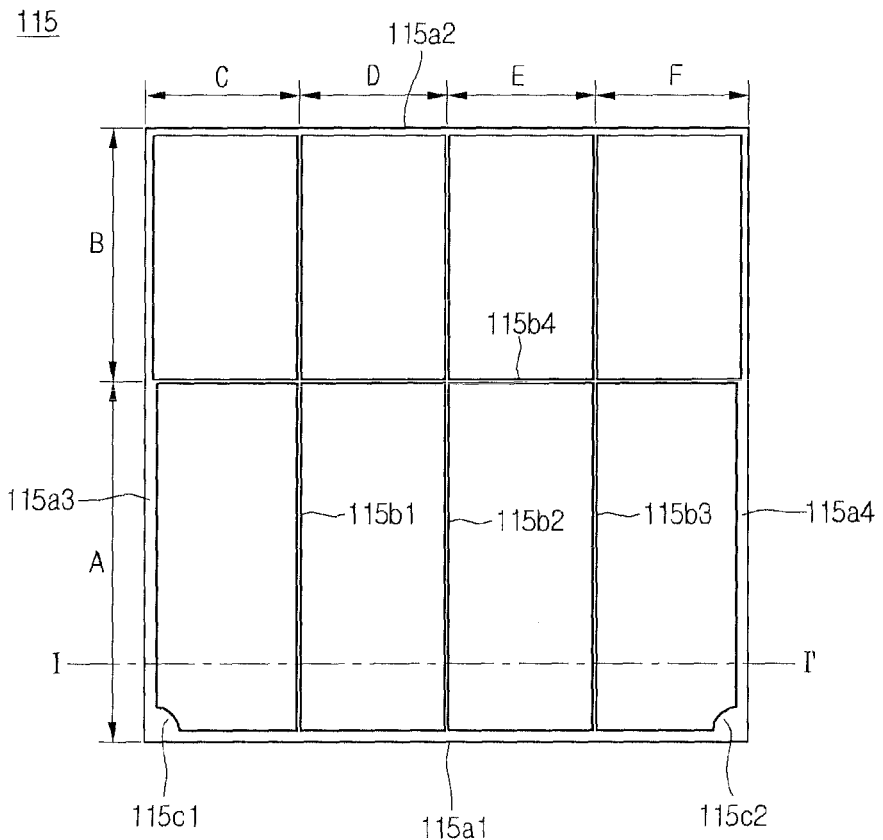
FIG. 13 is a diagram showing one example of planar-shape electrodes that may be used in a light emitting device according to any of the aforementioned embodiments.

The electrode layer 115 may include one or more outer electrodes 115a, one or more an inner electrodes 115b, and a pad unit (115c in FIG. 13). That is, the electrode unit may be composed of the outer electrode(s) 115a and the inner electrode(s) 115b.

The electrode layer 115 may overlap the protection layer 140 and the current blocking layer 145, at least at a predetermined portion. For example, the outer electrode 115a may perpendicularly overlap the protection layer 140 and the inner electrode 115b may perpendicularly overlap the current blocking layer 145. The outer electrode 115a may perpendicularly overlap the protection layer 140, when the current blocking layer 145 is not formed.

Since the protection layer overlaps the electrode 115, when the protection layer is a conductive protection layer, a large amount of current may be allowed to flow in the active layer 120 above the conductive protection layer. Therefore, light is emitted through a larger area from the active layer 120, such that the light efficiency of the light emitting device can be increased. Further, the operational voltage of the light emitting device 100 can be reduced.

When the protection layer 140 is a non-conductive protection layer, a small amount of current flows in the active layer 120 above the non-conductive protection layer, such that light may not be produced, and accordingly, the light efficiency of the light emitting device 100 may be reduced. However, since the electrode layer 115 is positioned where it overlaps the non-conductive protection layer, more current may be allowed to flow in the active layer 120 above the non-conductive protection layer. Therefore, light is emitted through a larger area from the active layer 120, such that the light efficiency of the light emitting device can be increased.

A passivation layer 180 may be formed at least on the sides of the light emitting structure layer 135. Further, the passivation layer 180 may be formed on top of the first conductive semiconductor layer 110 and the protection layer 140. The passivation layer 180 may be made of, for example, $SiO_2$, $SiO_x$, $SiO_xN_y$, $Si_3N_4$, or $Al_2O_3$ to electrically protect the light emitting structure layer 135.

FIG. 13 shows one example of planar-shape electrodes that may be included in the light emitting device. A cross-sectional shape taken along the line I-I' is shown in FIG. 1. The electrode layer containing the planar-shaped electrodes 115 is formed on the first conductive semiconductor layer 110. The electrodes may include outer electrode 115a that extend along the edge of the first conductive semiconductor layer 110 and inner electrode 115b that connects the first portion of the outer electrode 115a with the second portion of the outer electrode 115a. The inner electrode 115b may be disposed inside a region surrounded by the outer electrode 115a.

The outer electrode 115a may include a first outer electrode 115a1, a second outer electrode 115a2, a third outer electrode 115a3, and a fourth outer electrode 115a4. Further, the inner electrode 115b may include a first inner electrode 115b1, a second inner electrode 115b2, a third inner electrode 115b3, and a fourth inner electrode 115b4.

The outer electrode 115a may be at least partially formed within 50 μm from the outermost side of the top of the first conductive semiconductor layer 110, and may be in contact with the passivation layer 180. For example, the first outer electrode 115a1, the second outer electrode 115a2, the third outer electrode 115a3, and fourth outer electrode 115a4 each may be at least partially disposed within 50 μm from the outermost side of the top of the first conductive semiconductor layer 110.

The outer electrode 115a may be disposed in a rectangular shape with four sides and four corners and includes the first outer electrode 115a1 and the second outer electrode 115a2 which extend in a first direction, and the third outer electrode 115a3 and the fourth outer electrode 115a4 which extend in a second direction, which is perpendicular to the first direction.

The pad unit 115c may include a first pad unit 115c1 and a second pad unit 115c2, in which the first pad unit 115c1 may be positioned at the joint of the first outer electrode 115a1 and the third outer electrode 115a3 and the second pad unit 115c2 may be positioned at the joint of the first outer electrode 115a1 and the fourth outer electrode 115a4.

The inner electrode 115b includes the first inner electrode 115b1, the second inner electrode 115b2, the third inner electrode 115b3 which extend in the second direction and connect the first outer electrode 115a1 with the second outer electrode 115a2, and the fourth inner electrode 115b4 that extends in the first direction and connects the third outer electrode 115a3 with the fourth outer electrode 115a4, which extend in the second direction.

The distance A between the first outer electrode 115a1 and the fourth inner electrode 115b4 may be larger than the distance B between the second outer electrode 115a2 and the fourth inner electrode 115b4.

Further, the distance C between the third outer electrode 115a3 and the first inner electrode 115b1, the distance D between the first inner electrode 115b1 and the second inner electrode 115b2, the distance E between the second inner electrode 115b2 and the third inner electrode 115b3, and the distance F between the third inner electrode 115b3 and the fourth outer electrode 115a4 may be substantially the same.

Further, the width of at least a part of the outer electrode 115a may be larger than the width of the inner electrode 115b Further, the width of at least a part of the outer electrode 115a may be larger than the width of the other parts of the outer electrode 115a. For example, the first outer electrode 115a1 may be formed larger in width than the inner electrode 115b and the first outer electrode 115a1 may be formed larger in width than the second outer electrode 115a2.

Further, the width adjacent to the first outer electrode 115a1 in the widths of the third outer electrode 115a3 and the fourth outer electrode 115a4 may be larger than the width adjacent to the second outer electrode 115a2. For example, the outer electrode 115a and the inner electrode 115b define a window-shaped opening, in which the width of the outer electrode 115a which is positioned at the wide portion of the opening may be larger than the width of the outer electrode which is positioned at the narrow portion of the opening.

The inner electrode 115b divides the inner region surrounded by the outer electrode 115a into a plurality of regions. The region that is adjacent to the first outer electrode 115a1, which has the largest width, in the regions is larger in area than the region that is adjacent to the second outer electrode 115a2 having a smaller width.

Further, the inner electrode 115b may be formed smaller in width than the outer electrode 115a. For example, the first outer electrode 115a1, and the portions of the third outer electrode 115ta3 and the fourth outer electrode 115a4, which are adjacent to the first outer electrode 115a1, may be formed to have a 25~35 μm width, the second outer electrode 115a2, and the portions of the third outer electrode 115a3 and the fourth outer electrode 115a4, which are adjacent to the second outer electrode 115a2, may be formed to have a 15~25 μm width, and the inner electrode 115b may be formed to have a 5~15 μm width.

The electrode layer 115 of the light emitting device according to the embodiment shown in FIG. 13 may be applied to the light emitting structure layer 135 of which one side is 800~1200 μm long. The light emission area may be reduced by the electrode layer 115, when the length of at least one side is less than 800 μm, while current may not be effectively supplied through the electrode layer 115, when the length of at least one side if less than 1200 μm. For example, the electrode layer 115 in FIG. 13 may be applied to the light emitting structure layer 135, which lengths and widths of 1000 μm.

The electrode layer 115 described above can reduce resistance and allow current from effectively distributed, in comparison with the area that the electrode 115 occupies.

Figure 14:
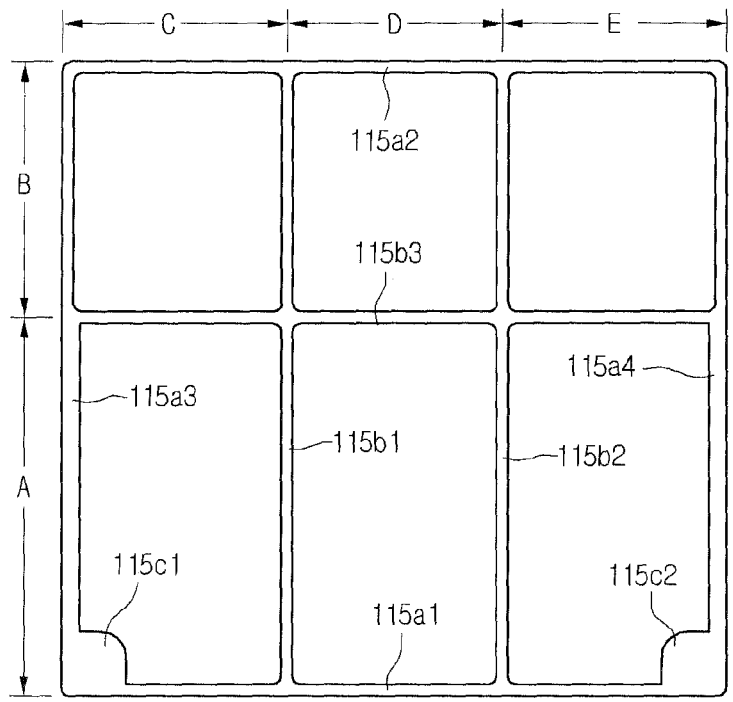
FIG. 14 is a diagram of another example of planar-shape electrodes that may be used in a light emitting device according to the aforementioned embodiments.

FIG. 14 shows another example of planar-shape electrodes that may be included in the light emitting device. The electrode layer is formed on the first conductive semiconductor layer 110 and may include outer electrode 115a that extends along the edge on top of the first conductive semiconductor layer 110 and inner electrode 115b that connects the outer electrode 115a.

The outer electrode 115a includes a first outer electrode 115a1, a second outer electrode 115a2, a third outer electrode 115a3, and a fourth outer electrode 115a4. Further, the inner electrode 115b may include a first inner electrode 115b1, a second inner electrode 115b2, and a third inner electrode 115b3.

The outer electrode 115a may be at least partially formed within 50 μm from the outermost side of the first conductive semiconductor layer 110, and may be in contact with the passivation layer 180.

The outer electrode 115a may be disposed in a rectangular shape with four sides and four corners and include the first outer electrode 115a1 and the second outer electrode 115a2 which extend in a first direction, and the third outer electrode 115a3 and the fourth outer electrode 115a4 which extend in a second direction, which is perpendicular to the first direction.

The pad unit 115c may include a first pad unit 115c1 and a second pad unit 115c2, in which the first pad unit 115c1 may be positioned at the joint of the first outer electrode 115a1 and the third outer electrode 115a3 and the second pad unit 115c2 may be positioned at the joint of the first outer electrode 115a1 and the fourth outer electrode 115a4.

The inner electrode 115b includes first inner electrode 115b1 and second inner electrode 115b2 which extend in the second direction and connect first outer electrode 115a1 with second outer electrode 115a2, and third inner electrode 115b3 that extends in the first direction and connects the third outer electrode 115a3 with the fourth outer electrode 115a4, which extend in the second direction.

The distance A between the first outer electrode 115a1 and the third inner electrode 115b3 may be larger than the distance B between the second outer electrode 115a2 and the third inner electrode 115b3.

Further, the distance C between the third outer electrode 115a3 and the first inner electrode 115b1, the distance D between the first inner electrode 115b1 and the second inner electrode 115b2, and the distance E between the second inner electrode 115b2 and the fourth outer electrode 115a4 may be substantially the same.

Further, the width of at least a portion of the outer electrode 115a may be larger than the width of the inner electrode 115b.

Further, the width of at least a part of the outer electrode 115a may be larger than the width of the other parts of the outer electrode 115a. For example, the first outer electrode 115a1 may be formed larger in width than the inner electrode 115b and the first outer electrode 115a1 may be formed larger in width than the second outer electrode 115a2.

Further, the width adjacent to the first outer electrode 115a1 in the widths of the third outer electrode 115a3 and the fourth outer electrode 115a4 may be larger than the width adjacent to the second outer electrode 115a2.

The inner electrode 115b divides the inner region surrounded by the outer electrode 115a into a plurality of regions. The region that is adjacent to the first outer electrode 115a1, which has the largest width, in the regions are larger in area than the region that is adjacent to the second outer electrode 115a2.

The electrode layer 115 of the light emitting device shown in FIG. 14 may be applied to the light emitting structure layer 135, of which one side is 800~1200 μm long. The light emission area may be reduced by the electrode 115, when the length of at least one side is less than 800 μm, while current may not be effectively supplied through the electrode layer 115 when the length of at least one side if less than 1200 µm. For example, the electrode layer 115 in FIG. 14 may be applied to the light emitting structure layer 135, which lengths and widths of 1000 µm.

The electrode 115 described above can reduce resistance and allow current from effectively distributed, in comparison with the area that the electrode 115 occupies.

Figure 15:
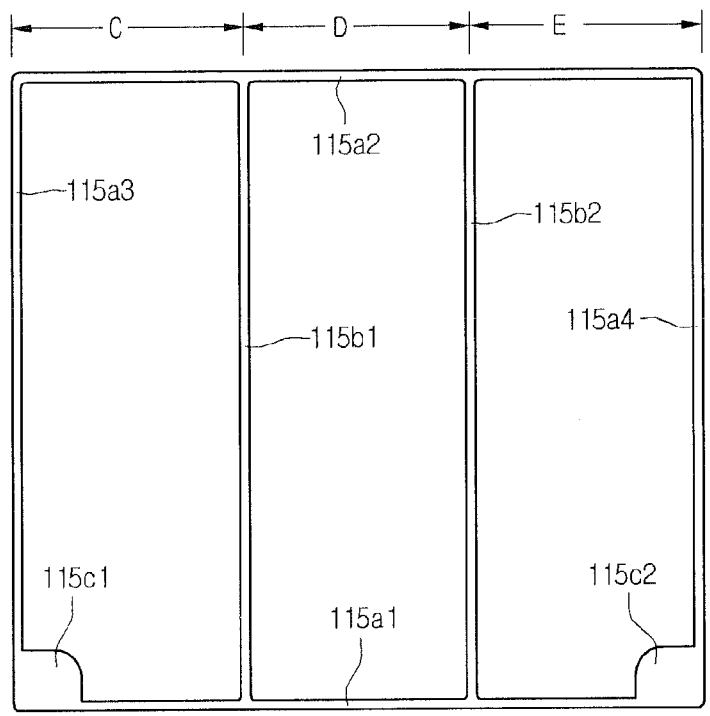
FIG. 15 is a diagram of another example of planar-shape electrodes that may be used in a light emitting device according to the aforementioned embodiments.

FIG. 15 shows another example of planar-shape electrodes that may be included in the light emitting device. The electrode layer 115 is formed on the first conductive semiconductor layer 110 and may include outer electrode 115a that extends along the edge on top of the first conductive semiconductor layer 110 and inner electrode 115b that connect is the outer electrode 115a.

The outer electrode 115a includes a first outer electrode 115a1, a second outer electrode 115a2, a third outer electrode 115a3, and a fourth outer electrode 115a4. Further, the inner electrode 115b may include a first inner electrode 115b1 and a second inner electrode 115b2.

The outer electrode 115a may be at least partially formed within 50 µm from the outermost side of the first conductive semiconductor layer 110, and may be in contact with the passivation layer 180.

The outer electrode 115a may be disposed in a rectangular shape with four sides and four corners and may include the first outer electrode 115a1 and the second outer electrode 115a2 which extend in a first direction, and the third outer electrode 115a3 and the fourth outer electrode 115a4 which extend in a second direction, which is perpendicular to the first direction.

The pad unit 115c may include a first pad unit 115c1 and a second pad unit 115c2, in which the first pad unit 115c1 may be positioned at the joint of the first outer electrode 115a1 and the third outer electrode 115a3 and the second pad unit 115c2 may be positioned at the joint of the first outer electrode 115a1 and the fourth outer electrode 115a4.

The inner electrode includes the first inner electrode 115b1 and the second inner electrode 115b2 which extend in the second direction and connect the first outer electrode 115a1 and the second outer electrode 115a2, which extend in the first direction.

The distance C between the third outer electrode 115a3 and the first inner electrode 115b1, the distance D between the first inner electrode 115b1 and the second inner electrode 115b2, and the distance E between the second inner electrode 115b2 and the fourth outer electrode 115a4 may be substantially the same.

As described with reference to FIGS. 13 and 14, in the electrode layer 115 shown in FIG. 15, the width of at least a part of the outer electrode 115a may be larger than the width of the inner electrode 115b, while the width of at least a part of the outer electrode 115a may be larger than the other parts of the outer electrode 115a. For example, the first outer electrode 115a1 may be formed larger in width than the inner electrode 115b and the first outer electrode 115a1 may be formed larger in width than the second outer electrode 115a2. As shown in FIG. 15, the outer electrode 115a and the inner electrode 115b may be formed to have the same width.

The electrode layer 115 of the light emitting device shown in FIG. 15 may be applied to the light emitting structure layer 135, of which one side is 800~1200 µm long. The light emission area may be reduced by the electrode 115, when the length of at least one side is less than 800 µm, while current may not be effectively supplied through the electrode layer 115, when the length of at least one side if less than 1200 µm. For example, the electrode layer 115 shown in FIG. 15 may be applied to the light emitting structure layer 135, which lengths and widths of 1000 µm.

The electrode layer 115 described above can reduce resistance and allow current from effectively distributed, in comparison with the area that the electrode 115 occupies.

Figure 16:
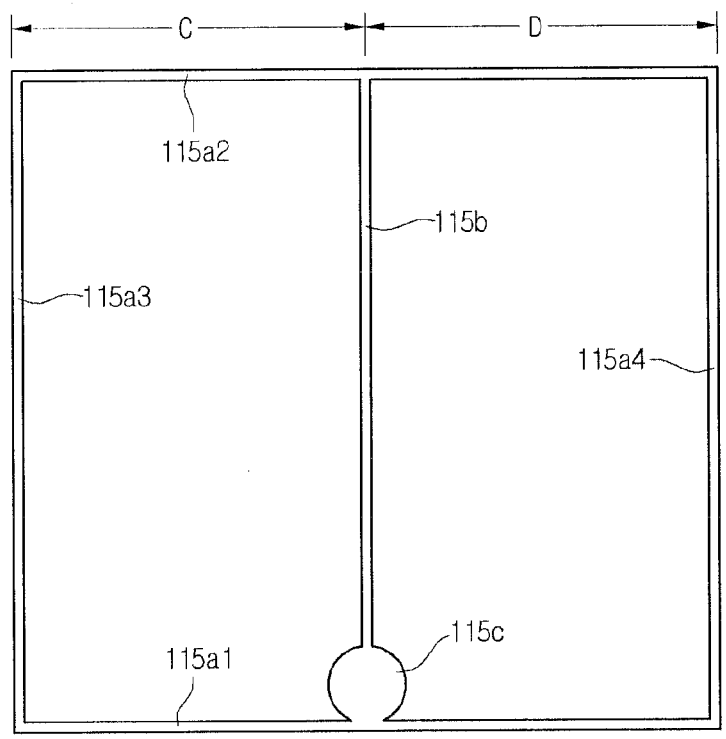
FIG. 16 is a diagram of another example of planar-shape electrodes that may be used in a light emitting device according to the aforementioned embodiments.

FIG. 16 shows another example of planar-shape electrodes that may be included in the light emitting device. The electrode layer 115 is formed on the first conductive semiconductor layer 110 and may include outer electrode 115a extending along the edge on top of the first conductive semiconductor layer 110 and inner electrode 115b connecting the outer electrode 115a with the outer electrode 115a.

The outer electrode 115a includes a first outer electrode 115a1, a second outer electrode 115a2, a third outer electrode 115a3, and a fourth outer electrode 115a4.

The outer electrode 115a may be at least partially formed within 50 µm from the outermost side of the first conductive semiconductor layer 110, and may be in contact with the passivation layer 180.

The outer electrode 115a may be disposed in a rectangular shape with four sides and four corners and may include the first outer electrode 115a1 and the second outer electrode 115a2 which extend in a first direction, and the third outer electrode 115a3 and the fourth outer electrode 115a4 which extend in a second direction, which is perpendicular to the first direction.

The pad unit 115c may be positioned at the joint of the first external electrode 115a1 and the inner electrode 115b. The inner electrode 115b extends in the second direction and connects the first outer electrode 115a1 with the second outer electrode 115a2, which extend in the first direction.

The distance C between the third outer electrode 115a3 and the inner electrode 115b may be substantially the same as the distance D between the inner electrode 115b and the fourth outer electrode 115a4.

As described with reference to FIGS. 13 and 14, in the electrode 115 shown in FIG. 16, the width of at least a part of the outer electrode 115a may be larger than the width of the inner electrode 115b, while the width of at least a part of the outer electrode 115a may be larger than the other parts of the outer electrode 115a.

For example, the first outer electrode 115a1 may be formed larger in width than the inner electrode 115b and the first outer electrode 115a1 may be formed larger in width than the second outer electrode 115a2. As shown in FIG. 16, the outer electrode 115a and the inner electrode 115b may be formed to have the same width.

The electrode layer 115 of the light emitting device in FIG. 16 may be applied to the light emitting structure layer 135 of which one side is 400~800 µm long. The light emission area may be reduced by the electrode layer 115, when the length of at least one side is less than 400 µm, while current may not be effectively supplied through the electrode layer 115 when the length of at least one side if less than 800 µm. For example, the electrode 115 shown in FIG. 16 may be applied to the light emitting structure layer 135, which lengths and widths of 600 µm.

The electrode 115 described above can reduce resistance and allow current from effectively distributed, in comparison with the area that the electrode 115 occupies.

Figure 17:
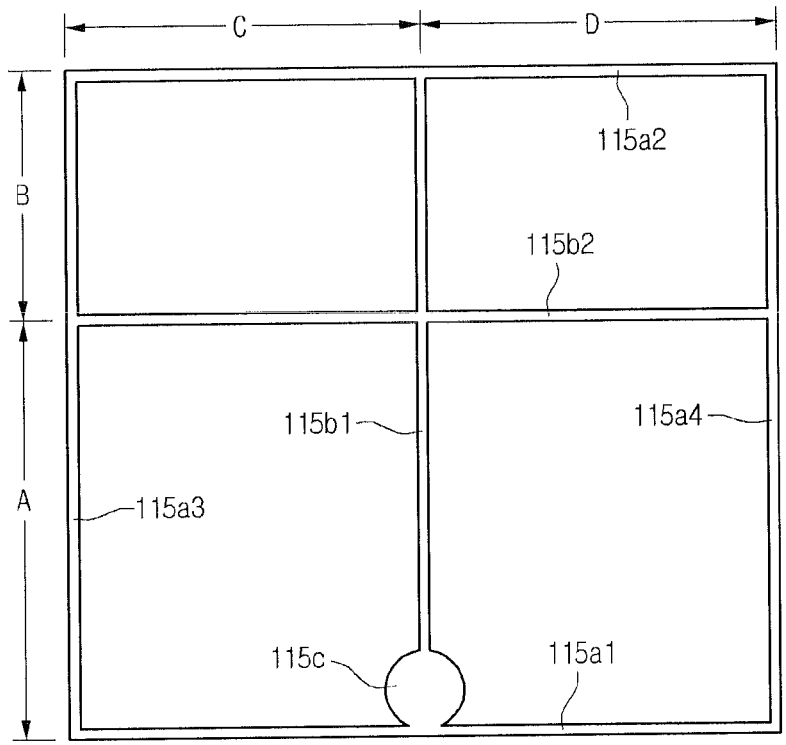
FIG. 17 is a diagram of another example of planar-shape electrodes that may be used in a light emitting device according to the aforementioned embodiments.

FIG. 17 shows another example of planar-shape electrodes that may be used in the light emitting device. The electrode layer 115 is formed on the first conductive semiconductor layer 110 and may include outer electrode 115a that extends along the edge on top of the first conductive semiconductor layer 110 and inner electrode 115b that connect with the outer electrode 115a.

The outer electrode 115a includes a first outer electrode 115a1, a second outer electrode 115a2, a third outer electrode 115a3, and a fourth outer electrode 115a4. Further, the inner electrode 115b may include a first inner electrode 115b1 and a second inner electrode 115b2.

The outer electrode 115a may be at least partially formed within 50 μm from the outermost side of the first conductive semiconductor layer 110, and may be in contact with the passivation layer 180.

The outer electrode 115a may be disposed in a rectangular shape with four sides and four corners and includes the first outer electrode 115a1 and the second outer electrode 115a2 which extend in a first direction, and the third outer electrode 115a3 and the fourth outer electrode 115a4 which extend in a second direction, which is perpendicular to the first direction.

The pad unit 115c may be positioned at the joint of the first external electrode 115a1 and the first inner electrode 115b1.

The inner electrode 115b includes the first inner electrode 115b1 that extends in the second direction and connects the first outer electrode 115a1 with the second outer electrode 115a2, and the second inner electrode 115b2 that extends in the first direction and connects the third outer electrode 115a3 with the fourth outer electrode 115a4, which extend in the second direction.

The distance A between the first outer electrode 115a1 and the second inner electrode 115b2 may be larger than the distance B between the second outer electrode 115a2 and the second inner electrode 115b2.

Further, the distance C between the third outer electrode 115a3 and the first inner electrode 115b1 may be substantially the same as the distance D between the first inner electrode 115b1 and the fourth outer electrode 115a4.

As described with reference to FIGS. 13 and 14, in the electrode layer 115 in FIG. 17, the width of at least a part of the outer electrode 115a may be larger than the width of the inner electrode 115b, while the width of at least a part of the outer electrode 115a may be larger than the other parts of the outer electrode 115a.

For example, the first outer electrode 115a1 may be formed larger in width than the inner electrode 115b and the first outer electrode 115a1 may be formed larger in width than the second outer electrode 115a2. As shown in FIG. 17, the outer electrode 115a and the inner electrode 115b may be formed to have the same width.

The inner electrode 115b divides the inner region surrounded by the outer electrode 115a into a plurality of regions. The region that is adjacent to the first outer electrode 115a1 in the regions is larger in area than the region that is adjacent to the second outer electrode 115a2.

The electrode layer 115 of the light emitting device in FIG. 17 may be applied to the light emitting structure layer 135 of which one side is 400~800 μm long. The light emission area may be reduced by the electrode 115, when the length of at least one side is less than 400 μm, while current may not be effectively supplied through the electrode 115, when the length of at least one side if less than 800 μm. For example, the electrode 115 shown in FIG. 17 may be applied to the light emitting structure layer 135, which lengths and widths of 600 μm.

The electrode 115 described above can reduce resistance and allow current from effectively distribution, compared to the area that electrode 115 occupies.

Figure 18:
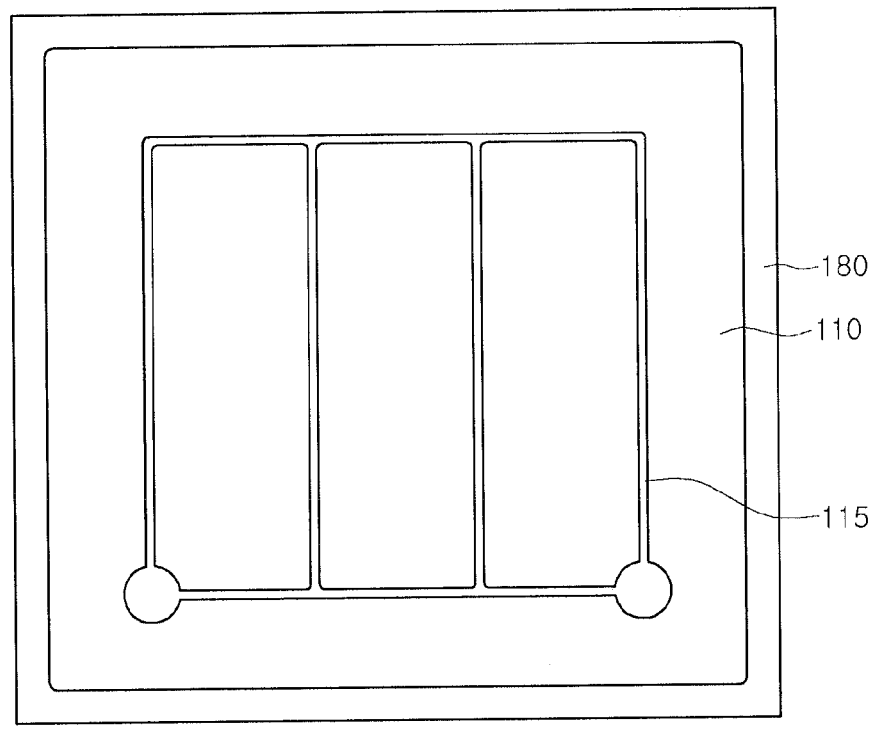
FIG. 18 is a diagram of a comparative embodiment of an electrode.
Figure 19:
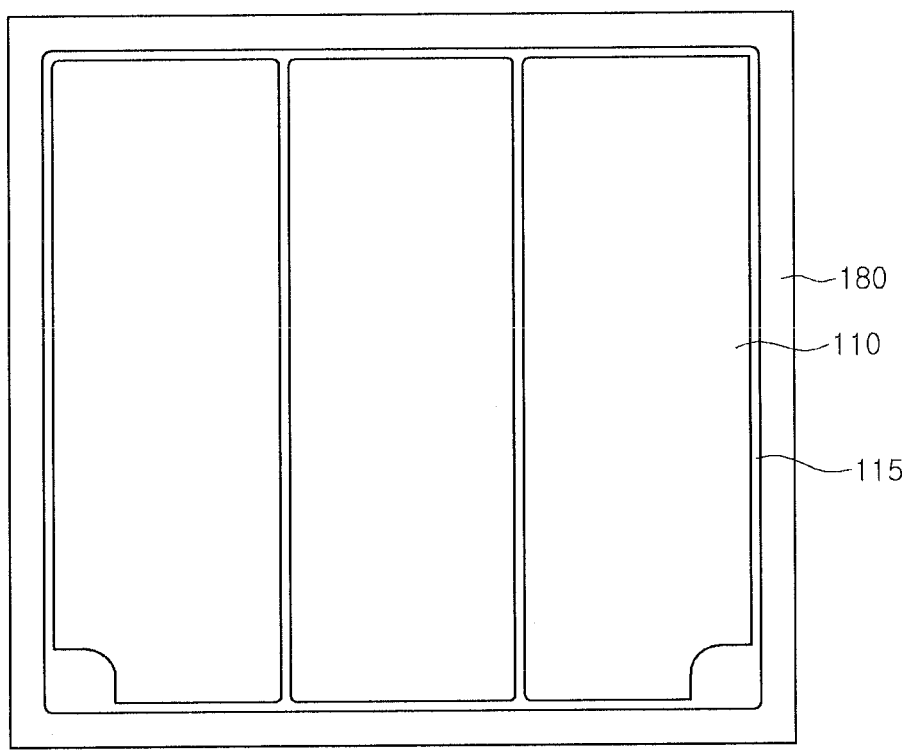
FIG. 19 is a diagram showing the electrode in FIG. 15.

FIGS. 18 and 19 show examples of light output in accordance with arrangement of electrodes in a light emitting device according to one or more of the aforementioned embodiments. More specifically, an electrode according to a comparative arrangement is shown in FIG. 18 and an electrode described with reference to FIG. 15 is shown in FIG. 19.

The electrode layer 115 in FIG. 18 and the electrode layer 115 in FIG. 19 have substantially the same shape. However, the electrode layer 115 according to the comparative arrangement in FIG. 18 is disposed at a distance above 50 μm from the outermost side of the top of the first conductive semiconductor layer 110, while the electrode 115 shown in FIG. 19 is at least partially disposed within 50 μm from the outermost side of the top of the first conductive semiconductor layer 110, in contact with the passivation layer 180.

According to an experiment, it could be seen that light output of 282 mW was measured in the comparative arrangement in FIG. 18 and light output of 304 mW was measured in the embodiment in FIG. 19, such that the light output was improved by 8%, when only the arrangement of electrodes 115 is changed, with the other conditions kept the same.

Figure 20:
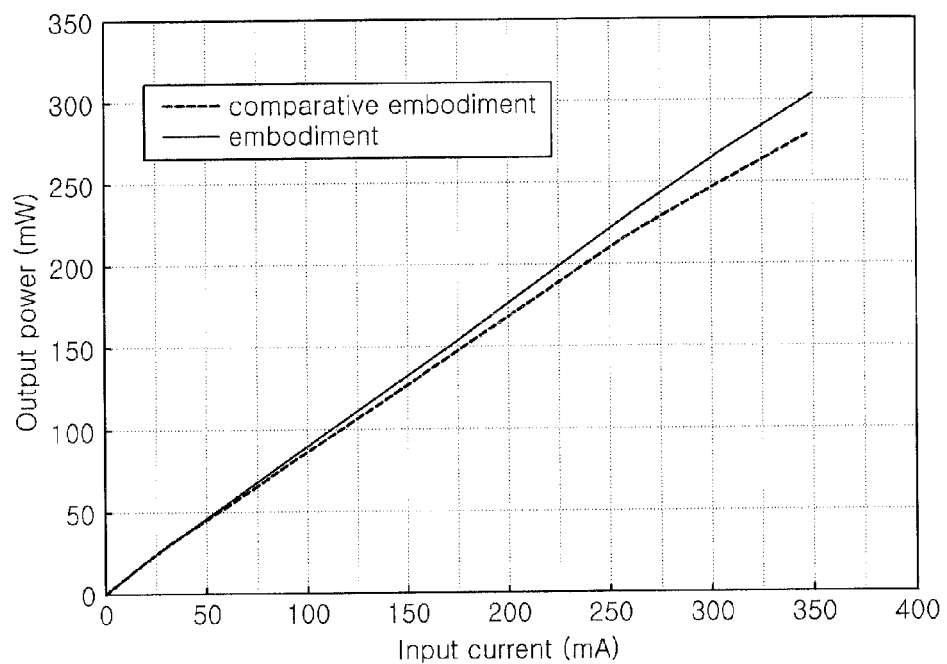
FIG. 20 is a diagram comparing light output of a light emitting device including the electrode of the embodiment in FIG. 13 with a light emitting device including the electrode of the comparative embodiment shown in FIG. 18.

FIG. 20 shows a comparison of light outputs of a light emitting device including the electrode embodiment in FIG. 13 with a light emitting device including the electrode of the comparative arrangement in FIG. 18.

According to an experiment, it can be seen that the light output of the light emitting device including the electrodes in FIG. 13 is excellent, compared with the light output of the light emitting device including the electrodes of the comparative arrangement in FIG. 18, when the electrodes 115 are arranged as illustrated in FIGS. 13 and 18, with the other conditions kept the same.

Figure 11:
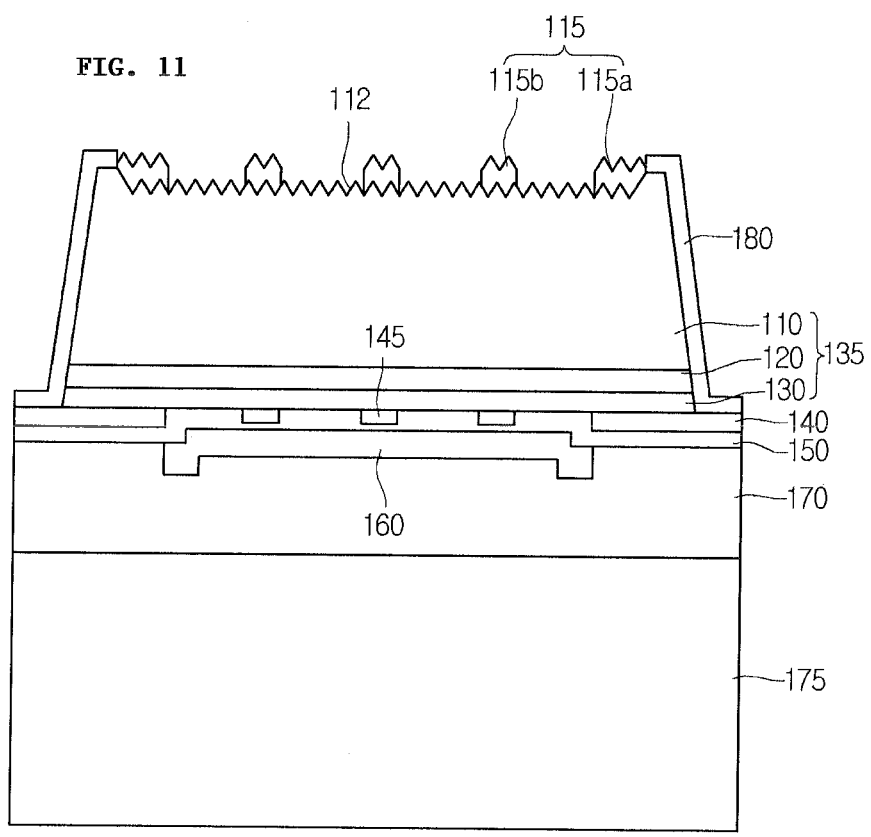
FIG. 11 is a diagram of a second embodiment of a light emitting device.

FIG. 11 shows a second embodiment of a light emitting device which has a structure similar to the light emitting device according to the first embodiment. However, in the light emitting device according to the second embodiment, the ohmic contact layer 150 extends to the sides of the light emitting device. That is, the ohmic contact layer 150 is disposed on the sides and the bottom of the protection layer 140, and the protection layer 140 and bonding layer 170 are spaced by the ohmic contact layer 150.

Figure 12:
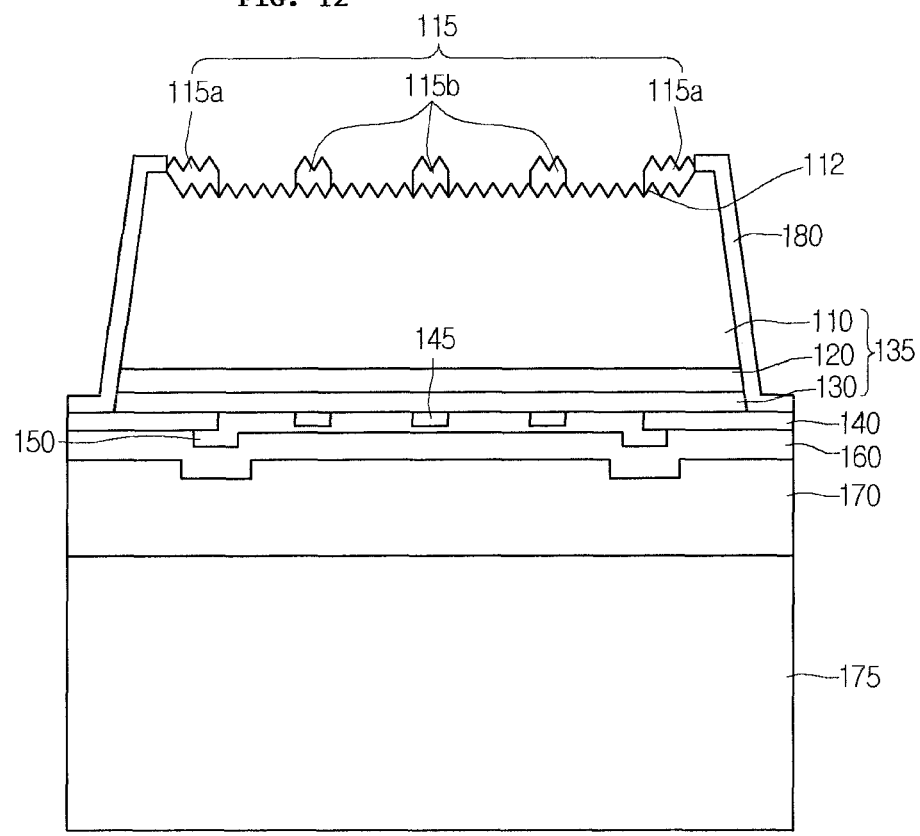
FIG. 12 is a diagram of a third embodiment of a light emitting device.

FIG. 12 shows a third embodiment of a light emitting device which has a structure similar to the light emitting device according to the first embodiment. However, in the light emitting device according to the third embodiment, the reflective layer 160 extends to the sides of the light emitting device.

That is, the reflective layer 160 is disposed on the bottoms of the protection layer 140 and the ohmic layer 150, and the protection layer 140 and the bonding layer 170 are spaced by the ohmic contact layer 160. The protection layer 140 is partially formed on the reflective layer 160. The reflective layer 160 can increase light efficiency by more effectively reflecting the light produced from the active layer 120, when being formed on the entire top of the bonding layer 170. Though not shown, the ohmic contact layer 150 and the reflective layer 160 may be disposed to extend to the sides of the light emitting device.

Figure 2:
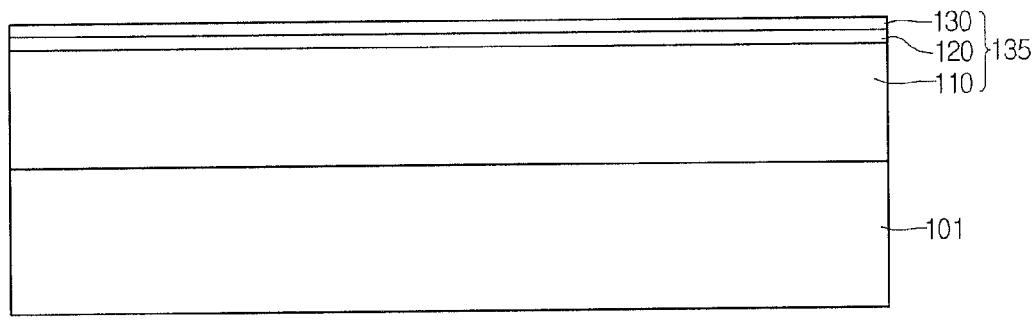
FIGS. 2 to 10 are diagrams showing steps included in one embodiment of a method of manufacturing a light emitting device.

FIGS. 2 to 10 show results produced by different steps included in one embodiment of a method for manufacturing a light emitting device. Referring to FIG. 2, the light emitting structure layer 135 is formed on a growth substrate 101. The growth substrate 101 may be made of, for example, at least one of sapphire (Al2O3), SiC, GaAs, GaN, ZnO, Si, GaP, InP, or Ge.

The light emitting structure layer 135 may be formed by sequentially growing the first conductive semiconductor layer 110, the active layer 120, and the second conductive semiconductor layer 130 on the growth substrate 101. The light emitting structure layer 135 may be formed by MOCVD (Metal Organic Chemical Vapor Deposition), CVD (Chemical Vapor Deposition), PECVD (Plasma-Enhanced Chemical Vapor Deposition), MBE (Molecular Beam Epitaxy), and HVPE (Hydride Vapor Phase Epitaxy), and is not limited thereto.

A buffer layer and/or an undoped nitride layer may be formed between the light emitting structure layer 135 and the growth substrate 101 to reduce a lattice constant difference.

Figure 3:
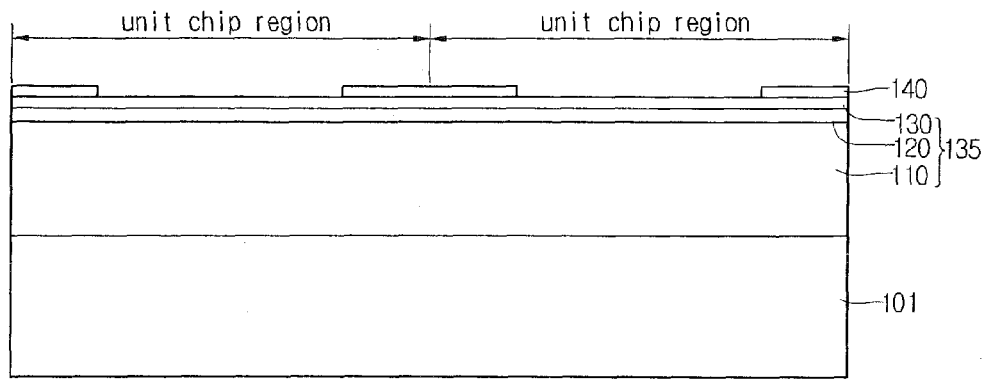

Referring to FIG. 3, the protection layer 140 is formed on the light emitting structure layer 135, corresponding to a unit chip region. The protection layer may be formed around the unit chip area by a mask pattern, and may be formed using various deposition methods.

In particular, when the protection layer 140 is a conductive protection layer and includes at least one of Ti, Ni, Pt, Pd, Rh, Ir, or W, the protection layer 140 can be formed to have high concentration by sputtering, such that it is not broken into fragments in isolation etching.

Figure 4:
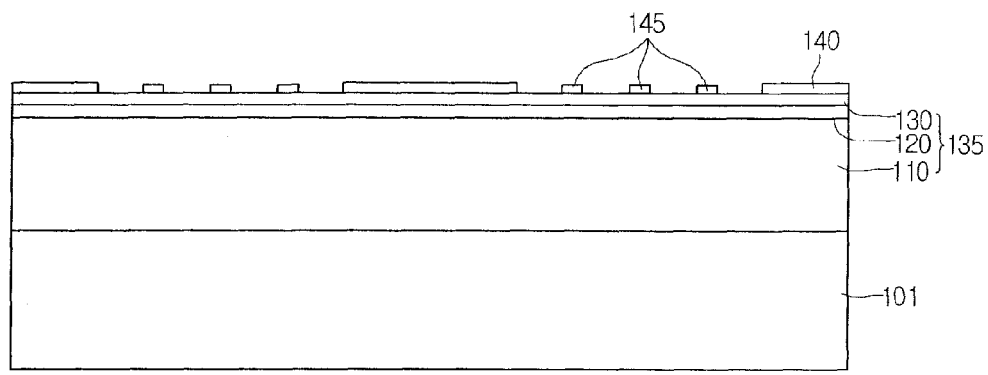

Referring to FIG. 4, the current blocking layer 145 may be formed on the second conductive layer 130. The current blocking layer 145 may be formed by a mask pattern. For example, the current blocking layer 145 may be formed by a mask pattern, after a SiO2 layer is formed on the second conductive semiconductor layer 130.

When the protection layer 140 is a non-conductive protection layer, the protection layer 140 and the current blocking layer 145 may be made of the same material. In this case, it is possible to simultaneously form the protection layer 140 and the current blocking layer 145 in one process, not in separate processes.

For example, the protection layer 140 and the current blocking layer 145 may be simultaneously formed by a mask pattern, after a SiO2 layer is formed on the second conductive semiconductor layer 130.

Figure 5:
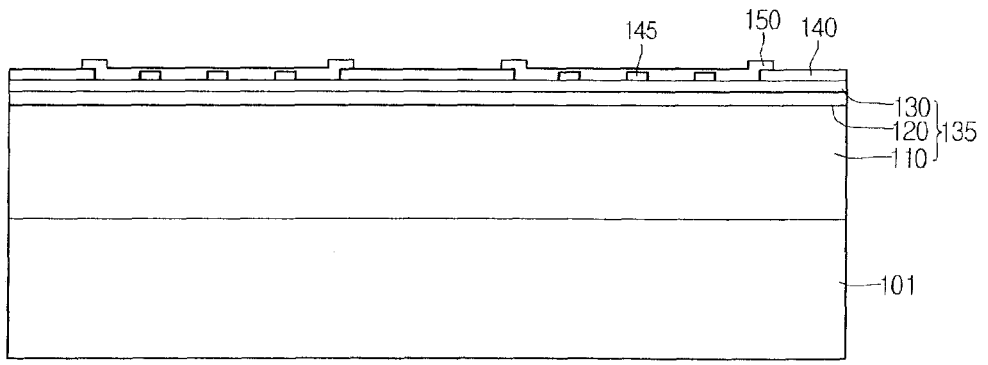
Figure 6:
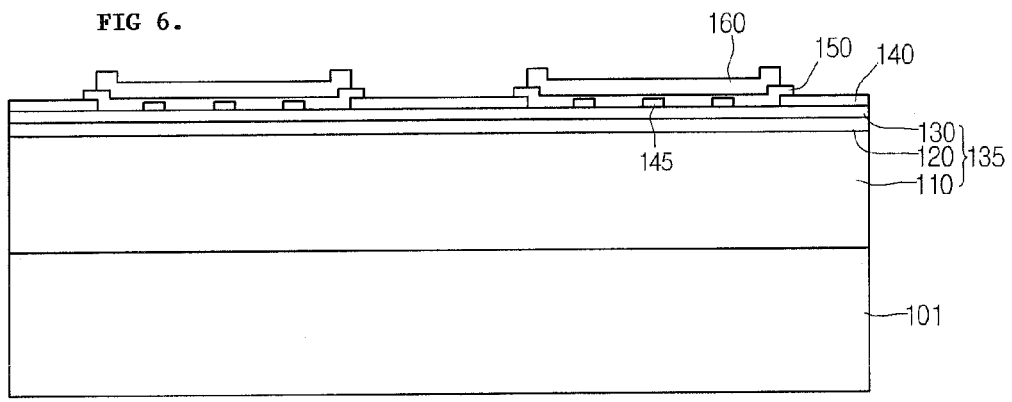

Referring to FIGS. 5 and 6, the ohmic contact layer 150 is formed on the second conductive semiconductor layer 130 and the current blocking layer 145, and then the reflective layer 160 may be formed on the ohmic contact layer 150.

When the protection layer 150 is a conductive protection layer, the ohmic contact layer 150 may be made of the same material as the protection layer 140, in which the protection layer 140 and the ohmic contact layer 150 may be simultaneously formed, after the current blocking layer 145 is formed on the second conductive semiconductor layer 130. The ohmic contact layer 150 and the reflective layer may be formed, for example, using any one of E-beam deposition, sputtering, or PECVD (Plasma Enhanced Chemical Vapor Deposition).

The area where the ohmic contact layer 150 and the reflective layer 160 are formed may be variously selected and the light emitting devices according to the other embodiments described with reference to FIGS. 11 and 12 may be formed in accordance with the area where the ohmic contact layer 150 and/or the reflective layer 160 are formed.

Figure 7:
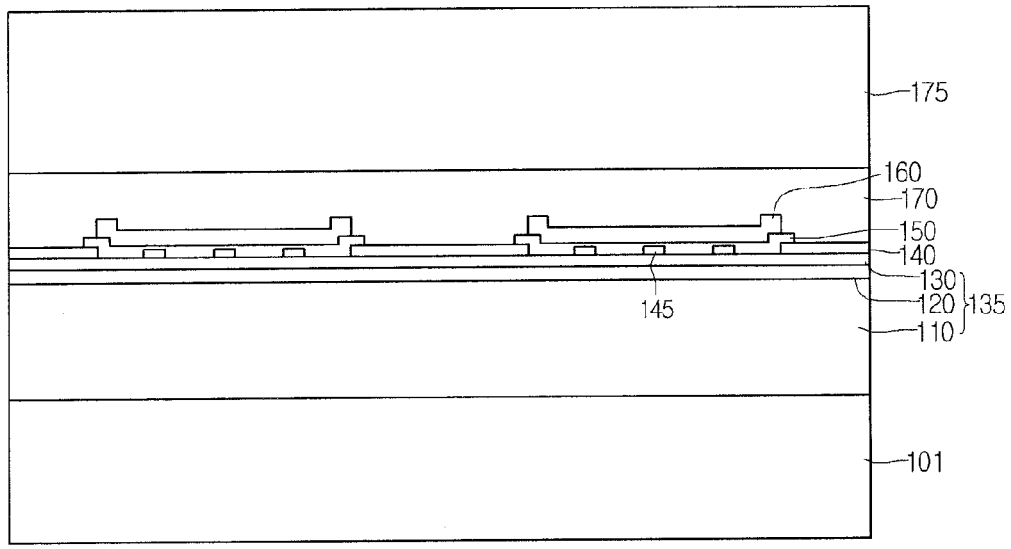

Referring to FIG. 7, the conductive support substrate 175 is formed above the reflective layer 160 and the protection layer 140 with the bonding layer 170 therebetween. The bonding layer 170 is in contact with the reflective layer 160, the ohmic contact layer 150, and the passivation layer 140 such that the bonding force can be strengthened between reflective layer 160, the ohmic contact layer 150, and the passivation layer 140.

The conductive support substrate 175 is attached to the bonding layer 170. Although it is exemplified in the embodiment that the conductive support substrate 175 is bonded by the bonding layer 170, the conductive support substrate 175 may be plated or deposited.

Figure 8:
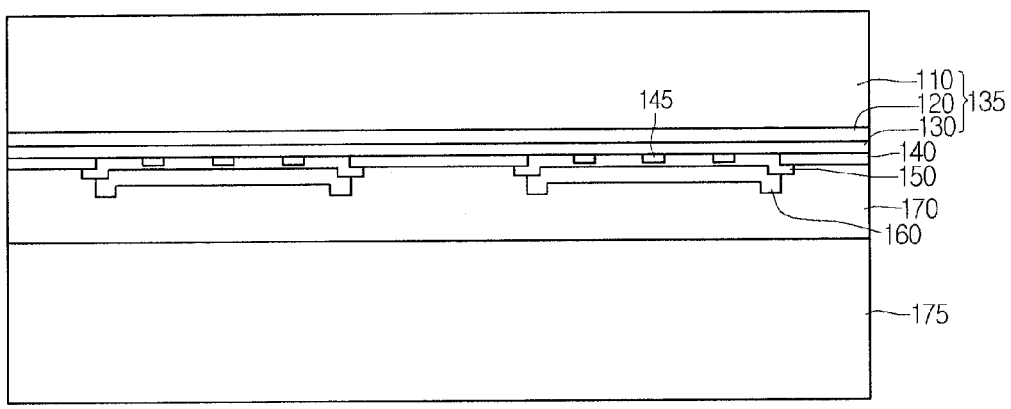

Referring to FIG. 8, the growth substrate 101 is removed from the light emitting structure layer 135. The structure shown in FIG. 7 is turned over in FIG. 8. The growth substrate 101 can be removed by laser lift-off or chemical lift-off.

Figure 9:
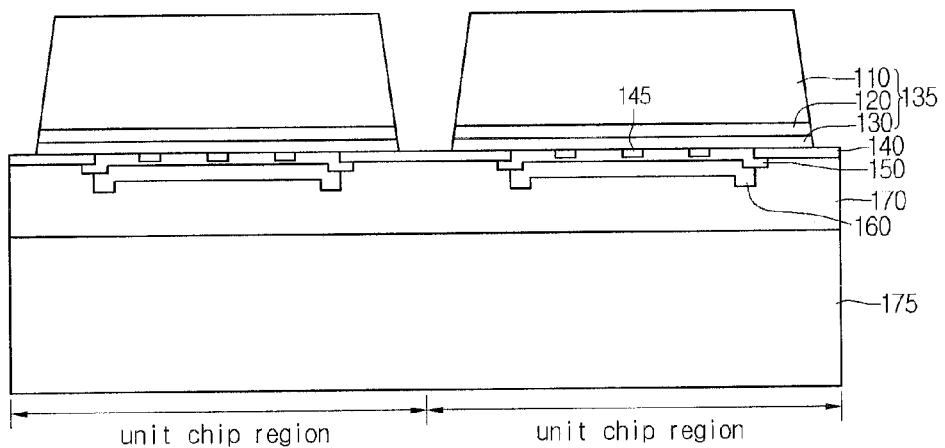

Referring to FIG. 9, the light emitting structure layer 135 is divided into a plurality of light emitting structure layers 135 by applying isolation etching to each unit chip. For example, the isolation etching may be performed by dry etching, such as ICP (Inductively Coupled Plasma).

Figure 10:
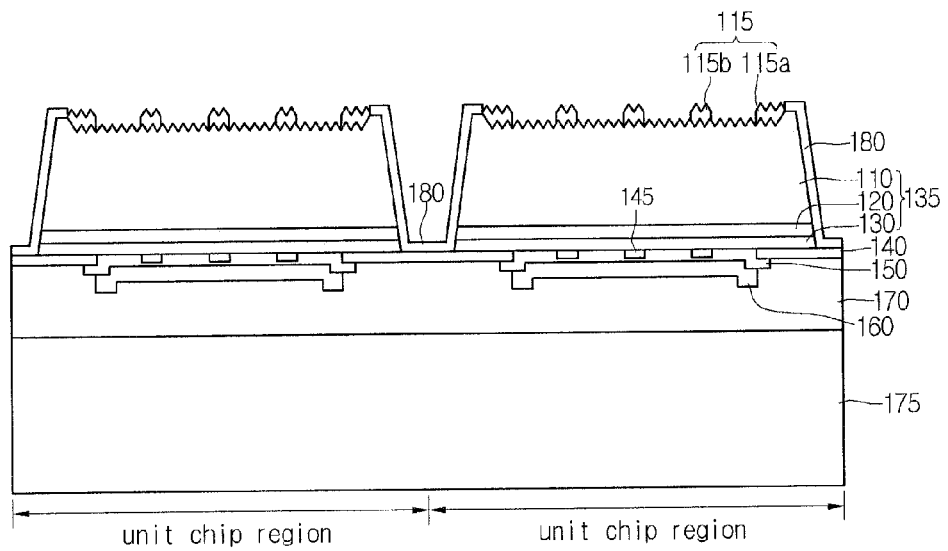

Referring to FIG. 10, the passivation layer 180 is formed on the protection layer 140 and the light emitting structure layer 135 and the passivation layer 180 is selectively removed such that the top of the first conductive semiconductor layer 110 is exposed.

Further, a roughness pattern 112 is formed on the top of the first conductive semiconductor layer 110 to improve light extraction efficiency and the electrode 115 is formed on the roughness pattern 112. The roughness pattern 112 may be formed by wet etching or dry etching.

Further, a plurality of light emitting devices can be manufactured by dividing the structure in unit chip regions, using a chip separation process. The chip separation process may include, for example, a braking process that separate the chips by applying physical force with a blade, a laser scribing process that separates the chips by radiating laser to the chip interfaces, and an etching including wet etching and dry etching, but it is not limited thereto.

Figure 21:
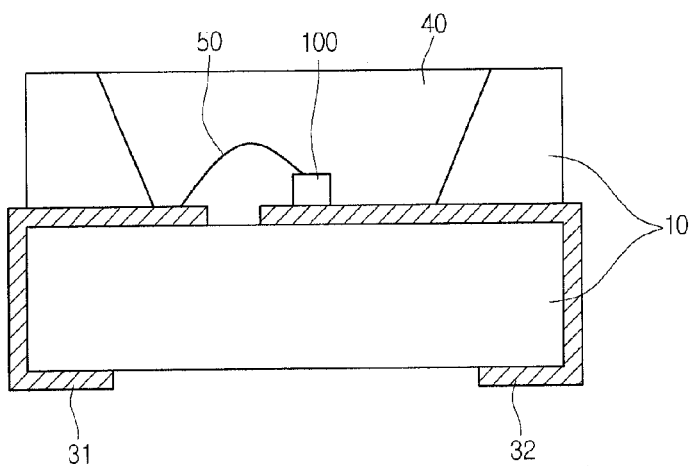
FIG. 21 is a diagram of an embodiment of a light emitting device package including one of the aforementioned embodiments of the light emitting device.

FIG. 21 shows a cross-sectional view of one embodiment of a light emitting device package that includes one or more light emitting devices according to any of the aforementioned embodiments.

Referring to FIG. 21, a light emitting device package according to an embodiment includes a package body 10, a first electrode 31 and a second electrode 32 which are installed at the package body 10, a light emitting device 100 installed in the package body 10 and electrically connect the first electrode 31 with the second electrode 32, and a molding member 40 covering the light emitting device 100.

The package body 10 may include a silicon material, a synthetic resin material, and a metal material, and may have a cavity with inclined sides.

The first electrode 31 and the second electrode 32 are electrically disconnected and supply power to the light emitting device 100. Further, the first electrode 31 and the second electrode 32 can increase light efficiency by reflecting light produced from the light emitting device 100, and may function of discharging heat generated from the light emitting device 100 to the outside.

The light emitting device 100 may be installed on the package body 10 or on the first electrode 31 and the second electrode 32.

The light emitting device 100 may be electrically connected with the first electrode 31 and the second electrode 32 by any one of a wire way, a flip-chip way, and a die bonding way. Exemplified in the embodiment, the light emitting device 100 is electrically connected with the first electrode 31 by a wire 50 and electrically connected with the second electrode 32 by direct contact.

The molding member 40 can protect the light emitting device 100 by covering the light emitting device 100. Further, fluorescent substances may be included in the molding member 40 to change the wavelength of light emitted from the light emitting device 100.

According to one embodiment, a plurality of light emitting device packages are arrayed on the substrate, and a light guide panel, a prism sheet, a diffusion sheet, and a fluorescent sheet, which are optical components, may be disposed in the path of the light emitted from the light emitting device packages. The light emitting device package, the substrate, and the optical components may function as a backlight unit or a lighting unit, and for example, the light system may include a backlight unit, a lighting unit, an indicator, a lamp, and a street lamp.

FIG. 22 shows one embodiment of a backlight unit 1100 that includes a light emitting device or a light emitting device package. The backlight unit 1100 shown in FIG. 22 is an example of a lighting system and not limited thereto.

Referring to FIG. 22, the backlight unit 1100 may include a bottom frame 1140, a light guide member 1120 disposed inside the bottom frame 1140, and a light emitting module 1110 disposed at least on one side or the bottom of the light guide member 1120. Further, a reflective sheet 1130 may be disposed under the light guide member 1120.

The bottom frame may be formed in a box shape with the top open to accommodate the light guide member 1120, the light emitting module 1110, and the reflective sheet 1130 and may be made of metal or resin, for example.

The light emitting module 1110 may include a substrate 700 and a plurality of light emitting device package 600 mounted on the substrate 700. The light emitting device package 600 may provide light to the light guide member 1120. Although it is exemplified in the embodiment that the light emitting device packages 600 are mounted on the substrate 700 in the light emitting module 1110, the light emitting device 100 according to an embodiment may be directly mounted thereon.

As shown in the figures, the light emitting module 1110 may be disposed on at least any one of the inner sides of the bottom frame 1140, and accordingly, light can be provided to at least one side of the light guide member 1120. However, the light emitting module 1110 may be disposed under the bottom frame 1140 to provide light to the bottom of the light guide member 1120, which can be modified in various ways in accordance with design of the backlight unit 1100 and is not limited thereto.

The light guide member 1120 may be disposed inside the bottom frame 1140. The light guide member 1120 can convert the light provided from the light emitting module 1110 in surface light and guide it to a display panel (not shown).

The light guide member 1120 may be, for example, an LGP (Light Guide Panel). The light guide panel may be made of, for example, one of acryl resin, such as PMMA (polymethyl metaacrylate), and PET (polyethylene terephthlate), PC (poly carbonate), COC, and PEN (polyethylene naphthalate) resin.

An optical sheet 1150 may be disposed on the light guide member 1120. The optical sheet 1150 may includes, for example, at least one of a diffusion sheet, a light collecting sheet, a luminance increasing sheet, and a fluorescent sheet. For example, the optical sheet 1150 may be formed by stacking a diffusion sheet, a light collecting sheet, a luminance increasing sheet, and a fluorescent sheet. In this configuration, diffusion sheet 1150 uniformly diffuses the light radiated from light emitting module 1110 and diffused light can be collected to the display panel by the light collecting sheet.

In this configuration, the light from the light collecting sheet is light randomly polarized and the luminance increasing sheet can increase degree of polarization of the light from the light collecting sheet. The light collecting sheet may be, for example, a horizontal or/and a vertical prism sheet. Further, the luminance increasing sheet may be, for example, a dual brightness enhancement film. Further, the florescent sheet may be a light transmissive plate or film, which includes fluorescent substances.

A reflective sheet 1130 may be disposed under the light guide member 1120. The reflective sheet 1130 can reflect light emitted through the bottom of the light guide member 1120, toward the exit surface of the light guide member 1120. The reflective sheet 1130 may be made of resin having high reflective ratio, for example PET, PC, or PVC resin.

FIG. 23 shows one embodiment of a lighting unit 1200 that includes a light emitting device or a light emitting device package according to any of the aforementioned embodiments. The lighting unit 1200 shown in FIG. 23 is an example of a lighting system.

Referring to FIG. 23, the lighting unit 1200 may include a case body 1210, a lighting module installed to the case body 1210, and a connecting terminal 1220 installed to the case body 1210 and provided with power from an external power supply. It is preferable that the case body 1210 is made of a material having good heat dissipation properties and may be made of metal or resin, for example.

The light emitting module 1230 may include a substrate 700 and at least one light emitting device package 600 mounted on the substrate 700. Although it is exemplified in the embodiment that the light emitting device packages 600 are mounted on the substrate 700 in the light emitting module 1110, the light emitting device 100 according to an embodiment may be directly mounted thereon.

The substrate 700 may be formed by printing a circuit pattern on an insulator and may include, for example, a common PCB (Printed Circuit Board), a metal core PCB, a flexible PCB, and a ceramic PCB.

Further, the substrate 700 is made of a material efficiently reflecting light, or the surface may have a color efficiently reflecting light, such as white and silver.

At least one of the light emitting device package 600 may be mounted on the substrate 700. The light emitting device packages 600 each may include at least one LED (Light Emitting Diode). The light emitting diodes may include color light emitting diodes that produce colors, such as red, green, blue, or white, and UV light emitting diodes that produce ultraviolet rays.

The light emitting module 1230 may be disposed to have various combinations of light emitting diodes to achieve the impression of a color and luminance. For example, white light emitting diodes, red light emitting diodes, and green light emitting diodes may be combined to ensure high CRI.

Further, a fluorescent sheet may be further disposed in the traveling path of the light emitted from the light emitting module 1230 and changes the wavelength of the light emitted from the light emitting module 1230. For example, when the light emitted from the light emitting module 1230 has a blue wavelength band, yellow fluorescent substances may be included in the fluorescent sheet, and the light emitted from the light emitting module 1230 is finally shown as white light through the fluorescent sheet.

The connecting terminal 12220 can supply power by being electrically connected with the light emitting module 1230. According to the embodiment shown in FIG. 23, the connecting terminal 1220 is turned and inserted in an external power supply, like a socket, but is not limited thereto. For example, the connecting terminal 1220 may be formed in a pin shape to be inserted in an external power supply or may be connected to the external power supply by a wire.

Since at least any one of the light guide member, a diffusion sheet, a light collecting sheet, a luminance increasing sheet, and a fluorescent sheet is disposed in the traveling path of the light emitted form the light emitting module in the lighting system as described above, it is possible to achieved desired optical effects.

As described above, the lighting system can achieve high light efficiency and reliability, by including light emitting devices having reduced operational voltage and improved light efficiency or light emitting packages.

One or more embodiments described herein provide a light emitting device having reduced operational voltage, a light emitting device manufacturing method, a light emitting device package, and a lighting system. One or more of these embodiments further provide a light emitting device having improved light efficiency, a light emitting device manufacturing method, a light emitting device package, and a lighting system.

A light emitting device according to an embodiment includes: a conductive support substrate; a bonding layer on the conductive support substrate; a reflective layer on the bonding layer; an ohmic contact layer on the reflective layer; a current blocking layer on the ohmic contact layer; a protection layer at a periphery portion on the bonding layer; a light emitting structure layer on the current blocking layer, the ohmic contact layer, and the protection layer; and electrodes at least partially overlapping the current blocking layer and the protection layer, on the light emitting structure layer, in which the protection layer is made of a material having electric conductivity lower than the reflective layer of the ohmic contact layer, an electric insulation material, or a material that is in schottky contact with the light emitting structure layer.

A light emitting device according to another embodiment includes: a conductive support substrate; a light emitting structure layer on the conductive support substrate; a conductive protection layer disposed at a periphery portion on the conductive support substrate and partially disposed between the conductive support substrate and the light emitting structure layer; and electrodes disposed on the light emitting structure layer and at least partially overlapping the conductive protection layer, in which the light emitting structure layer has inclined sides, and the inclined sides overlap the conductive protection layer.

A light emitting device according to another embodiment includes: a conductive support substrate; a light emitting structure layer on the conductive support substrate; a protection layer disposed at a periphery portion on the conductive support substrate and partially disposed between the conductive support substrate and the light emitting structure layer; and electrodes at least partially overlapping the protection layer on the light emitting structure layer, in which the electrodes includes outer electrodes, inner electrodes disposed inside the outer electrodes and connecting the first portions and the second portions of the outer electrodes, and pad units connected to the outer electrodes.

According to another embodiment, a light emitting device includes a contact layer; a blocking layer over the contact layer; a protection layer adjacent the blocking layer; a light emitter over the blocking layer; and an electrode layer coupled to the light emitter. The electrode layer overlaps the blocking layer and protection layer and wherein the blocking layer has an electrical conductivity that substantially blocks flow of current from the light emitter in a direction towards the contact layer.

The blocking layer includes a plurality of spaced current blocking segments, and current flows to the light emitter through areas between respective pairs of the current blocking segments. The electrode layer may include a plurality of electrode segments aligned with respective ones of the spaced current blocking segments.

The protection layer may be made of a conductive material and wherein current flows to the light emitter through the protection layer, and additional current may flow to the light emitter in an area located between the protection layer and the blocking layer.

The blocking layer and the protection layer may be substantially co-planar, and the blocking layer may separate a first portion and a second portion of the protection layer. The blocking layer may be aligned with a central region of the light emitter, and the first and second portions of the protection layer are aligned on either side of the central region. The protection layer may be between a bonding layer under the light emitter.

In addition, the light emitter may have a top surface with a predetermined pattern, the pattern substantially corresponding to the predetermined pattern of the top surface of the light emitter.

The width of the contact layer may be equal to or greater than a width of the light emitter, and a reflective layer may be provided adjacent the contact layer. A width of the reflective layer is less than a width of the light emitter, or the width of the reflective layer is greater than a width of the light emitter.

The protection layer may be made of a non-conductive material and is substantially coplanar with the blocking layer, and wherein current flows into the light emitter through one or more spaces between the protection layer and the blocking layer.

The blocking layer and/or protection may be made of a material having an electrical conductivity lower than at least one of a reflective layer to reflect light from the light emitter, the contact layer, an electric insulation material included in the light emitting device, or a material that is in Schottky contact with the light emitter.

The light emitter has inclined sides and wherein the inclined sides overlap the protection layer, and the electrode layer may include at least two outer electrode segments; and one or more inner electrode segments between the two outer electrode segments, wherein the two outer electrode segments and one or more inner electrode segments are spaced from one another.

The two outer electrode segments and the one or more inner electrode segments are substantially equally spaced, and the two outer electrode segments and the one or more inner electrode segments are connected to one another to form a predetermined pattern. The predetermined pattern includes one or more substantially rectangular sections formed by connections between the two outer electrode segments and the one or more inner electrode segments. Also, one or more pad parts may be coupled to the electrode layer.

According to another embodiment, light emitting device package may include a package body, first and second electrode layers coupled to the package body; and a light emitting device according to claim 1 electrically coupled to the first and second electrode layers.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments. The features of any one embodiment may be combined with the features of any other embodiment.

Although embodiments have been described with reference to a number of illustrative embodiments, numerous other modifications and embodiments can be devised by those skilled in the art that will fall within the spirit and scope of the principles of this disclosure. Particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
a conductive support substrate;
a light emitting structure layer over the conductive support substrate;
a protection layer provided over an outer periphery portion of the conductive support substrate, at least a portion of the protection layer being interposed between the conductive support substrate and the light emitting structure layer; and
an electrode structure at least partially overlapping the protection layer and disposed over the light emitting structure layer,
wherein the electrode structure includes an outer electrode including a first part and a second part, an inner electrode provided in a region between the first part and the second part of the outer electrode and extending to electrically connect the first part of the outer electrode with the second part of the outer electrode, and a pad electrically connected to at least one of the first part or the second part of the outer electrode, wherein at least one of the first part or the second part of the outer electrode comprises a first section extending from the pad and a second section extending from the first section, wherein a width of the first section is greater than a width of the second section, and wherein the first section has substantially the same width along a lengthwise direction of the first section.

2. The light emitting device of claim 1, wherein at least a portion of the outer electrode has a width greater than a width of the inner electrode.

3. The light emitting device of claim 1, wherein at least a portion of the electrode structure is provided within a distance of 50 μm from an upper side surface of the light emitting structure layer.

4. The light emitting device of claim 1, further comprising a passivation layer formed on a side surface and a portion of a top surface of the light emitting structure layer, wherein at least a portion of the electrode makes contact with the passivation layer.

5. The light emitting device of claim 1, wherein the protection layer includes a conductive protection layer, and the conductive protection layer includes a transparent conductive oxide film or includes at least one selected from the group consisting of Ti, Ni, Pt, Pd, Rh, Ir, and W.

6. The light emitting device of claim 1, wherein the protection layer includes a non-conductive protection layer, and the non-conductive protection layer includes an electric insulation material or a material making schottky contact with the light emitting structure layer.

7. The light emitting device of claim 1, wherein the outer electrode includes first and second outer electrodes extending in a first direction, and third and fourth outer electrodes extending in a second direction to be connected to the first and second outer electrodes, and wherein the inner electrode includes a first inner electrode interposed between the third and fourth outer electrodes and formed in the second direction to connect the first outer electrode to the second outer electrode.

8. The light emitting device of claim 1, wherein the outer electrode includes first and second outer electrodes extending in a first direction, and third and fourth outer electrodes extending in a second direction to be connected to the first and second outer electrodes, and wherein the inner electrode includes a first inner electrode, which is interposed between the third and fourth outer electrodes and formed in the second direction to connect the first outer electrode to the second outer electrode, and a second inner electrode, which is interposed between the first and second outer electrodes and formed in the first direction to connect the third outer electrode to the fourth outer electrode.

9. The light emitting device of claim 8, wherein a distance between the first outer electrode and the second inner electrode is greater than a distance between the second outer electrode and the second inner electrode.

10. The light emitting device of claim 1, wherein the outer electrode includes first and second outer electrodes extending in a first direction, and third and fourth outer electrodes extending in a second direction to be connected to the first and second outer electrodes, and wherein the inner electrode includes first and second inner electrodes interposed between the third and fourth outer electrodes and formed in the second direction to connect the first outer electrode to the second outer electrode.

11. The light emitting device of claim 1, wherein the outer electrode includes first and second outer electrodes extending in a first direction, and third and fourth outer electrodes extending in a second direction to be connected to the first and second outer electrodes, and wherein the inner electrode includes first and second inner electrodes which are interposed between the third and fourth outer electrodes and formed in the second direction to connect the first outer electrode to the second outer electrode, and a third inner electrode, which is interposed between the first and second outer electrodes and formed in the first direction to connect the third outer electrode to the fourth outer electrode.

12. The light emitting device of claim 11, wherein a distance between the first outer electrode and the third inner electrode is greater than a distance between the second outer electrode and the third inner electrode.

13. The light emitting device of claim 1, wherein the outer electrode includes first and second outer electrodes extending in a first direction, and third and fourth outer electrodes extending in a second direction to be connected to the first and second outer electrodes, and wherein the inner electrode includes first, second, and third inner electrodes which are interposed between the third and fourth outer electrodes and formed in the second direction to connect the first outer electrode to the second outer electrode, and a fourth inner electrode, which is interposed between the first and second outer electrodes and formed in the first direction to connect the third outer electrode to the fourth outer electrode.

14. The light emitting device of claim 13, wherein a distance between the first outer electrode and the fourth inner electrode is greater than a distance between the second outer electrode and the fourth inner electrode.

15. A light emitting device package comprising:
a package body,
first and second electrodes installed in the package body, and
a light emitting device installed in the package body to be electrically connected to the first and second electrodes, wherein the light emitting device includes:

a conductive support substrate;

a light emitting structure layer over the conductive support substrate;

a protection layer provided over an outer periphery portion of the conductive support substrate, at least a portion of the protection layer being interposed between the conductive support substrate and the light emitting structure layer;

an electrode structure at least partially overlapping the protection layer and disposed over the light emitting structure layer, and wherein the electrode structure includes an outer electrode including a first part and a second part, an inner electrode provided in a region between the first part and the second part of the outer electrode and extending to electrically connect the first part of the outer electrode with the second part of the outer electrode, and a pad electrically connected to at least one of the first part or the second part of the outer electrode, wherein the at least one of the first part or the second part of the outer electrode comprises a first section extending from the pad and a second section extending from the first section, wherein a width of the first section is greater than a width of the second section, and wherein the first section has substantially the same width along a lengthwise direction of the first section.

16. A light emitting device comprising:

a conductive support substrate;

a light emitting structure layer over the conductive support substrate;

a protection layer provided over an outer periphery portion of the conductive support substrate, and at least a portion of the protection layer is between the conductive support substrate and the light emitting structure layer; and an electrode structure that at least partially overlaps the protection layer and is disposed over the light emitting structure layer, wherein the electrode structure includes:

an outer electrode that includes a first part and a second part, an inner electrode between the first part and the second part of the outer electrode, and the inner electrode extending to electrically connect the first part of the outer electrode with the second part of the outer electrode, and a pad to electrically connect to the first part of the outer electrode, wherein the first part of the outer electrode includes a first outer electrode section that extends in a first direction from the pad and a second outer electrode section that extends, in the first direction, from the first outer electrode section, wherein a width, in a second direction, of the first outer electrode section is greater than a width, in the second direction, of the second outer electrode section, the second direction being different than the first direction, and wherein the width of the first outer electrode section remains substantially the same along the first outer electrode section.

17. The light emitting device of claim 16, wherein the second direction is perpendicular to the first direction.

* * * * *